United States Patent [19]

Inoue

[11] Patent Number: 5,614,754

[45] Date of Patent: Mar. 25, 1997

[54] HALL DEVICE

[75] Inventor: Kazuhiko Inoue, Yokohama, Japan

[73] Assignee: Kabushiki Kaisha Toshiba, Kanagawa-ken, Japan

[21] Appl. No.: 508,990

[22] Filed: Jul. 28, 1995

[30] Foreign Application Priority Data

Aug. 2, 1994 [JP] Japan .................................. 6-181192
Jul. 11, 1995 [JP] Japan .................................. 7-174562

[51] Int. Cl.$^6$ .................................................. H01L 29/82
[52] U.S. Cl. .................................. 257/421; 257/627
[58] Field of Search ................................. 257/421, 425, 257/426, 627

[56] References Cited

U.S. PATENT DOCUMENTS

4,025,941  5/1977  Kanda et al. ............................ 257/426
5,119,166  6/1992  Sridhar .................................... 257/421

Primary Examiner—Mark V. Prenty
Attorney, Agent, or Firm—Finnegan, Henderson, Farabow, Garrett & Dunner, L.L.P.

[57] ABSTRACT

A Hall device consists of a single-crystal semiconductor substrate of (110) orientation, an active region formed on the substrate, a pair of input current terminals for passing a predetermined current through the active region, and a pair of output voltage terminals for measuring a potential difference to be produced in a direction orthogonal to the predetermined current flowing between the input current terminals. The surface of the active region is in a (110) plane, to minimize a fluctuation in the offset output of the device due to internal stress and precisely measure a magnetic field. This device is resistive against heat caused by soldering when mounting the device on a system.

8 Claims, 7 Drawing Sheets

STANDARD (110) PROJECTION FOR CUBIC CRYSTAL

HALL DEVICE

BACKGROUND OF THE INVENTION

1. Field of the Invention

The present invention relates to a Hall device for detecting a magnetic field, and particularly, to a Hall device that is reliable and accurate.

2. Description of the Prior Art

A Hall device is a magnetic transducer using Hall effect, resulting from the Lorentz force on a moving charge carrier in an applied magnetic field, to pick up an electromotive force to be generated orthogonally to the outer product of an input current vector and a flux vector. The Hall device is formed on the surface of a pellet so that the direction of an input current is perpendicular to the direction of an output voltage.

Figure 1:
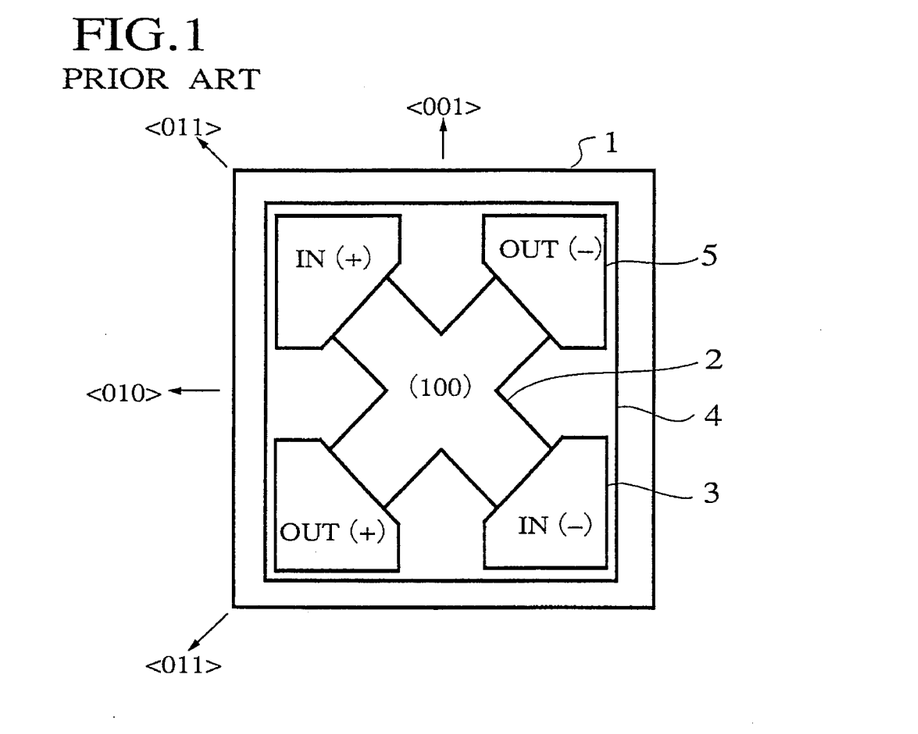
FIG. 1 is a plan view showing a Hall device according to a prior art.
Figure 2:
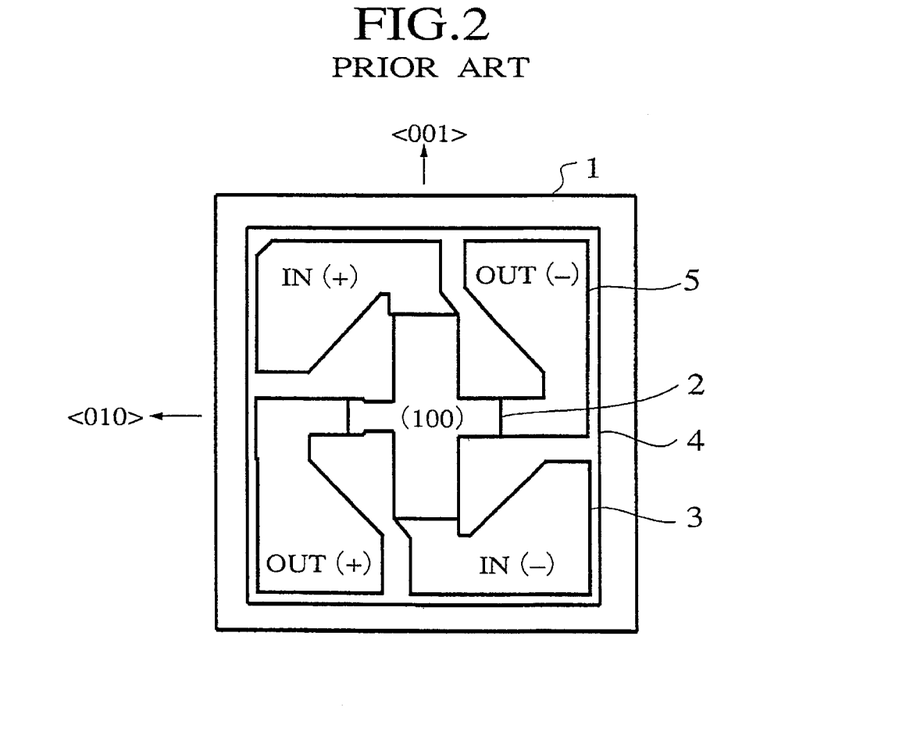
FIG. 2 is a plan view showing another Hall device according to the prior art.

FIGS. 1 and 2 show each an example of a semiconductor Hall device according to a prior art. Each of the Hall devices consists of a pellet 1 made of a semi-insulating GaAs substrate, a cross-shaped active region 2 formed on the pellet 1, an insulation film 4 made of silicon oxide to cover the surface of the substrate, a pair of input terminals 3, and a pair of output terminals 5. The input and output terminals 3 and 5 are electrically connected to the active region 2 through contact windows formed through the insulation film 4. The input and output metal electrode terminals 3 and 5 are used as bonding pads. Each of the Hall devices is formed from a semi-insulating GaAs wafer whose surface is in a (100) plane so that the side face of the pellet is in the (100) plane or a (110) plane. The orientation of the side face of a pellet is determined according to how the pellet is diced from a wafer. When the pellet is diced by scribing, the side face thereof is in the (100) plane because the direction of dicing is aligned with the direction of cleavage. When the pellet is diced with a blade, the side face thereof is in the (110) plane, to prevent the chipping of the wafer. In FIG. 1, the side face of the pellet 1 is in the (100) plane, and a current path is arranged at an angle of 45 degrees with respect to the edges of the pellet 1. In FIG. 2, a current path is arranged in parallel with the edges of the pellet 1. The input and output terminals 3 and 5 are usually arranged at the corners of the pellet 1, to improve the area efficiency of the pellet 1. Table 1 shows a combination of the orientations and directions of the faces and input/output paths of a Hall device according to the prior art.

TABLE 1

| Active layer orientation | Side face orientation of pellet | Direction of input current | Direction of output voltage |
| --- | --- | --- | --- |
| {100} | {100} | [100] | [100] |
| {100} | {100} | [110] | [110] |
| {100} | {110} | [100] | [100] |
| {100} | {110} | [110] | [110] |

The pellet 1 is mounted on a mold substrate, is bonded to wires, and is packaged with mold peripheral devices into a product.

An electromotive force measured between the output terminals of the Hall device is theoretically zero if there is no magnetic field. In practice, however, the electromotive force will not be zeroed due to minute asymmetry in the Hall device, or a fluctuation in the specific resistance of the active region of the device. Such a non-zero output is called an offset output $V_{HO}$.

Figure 4:
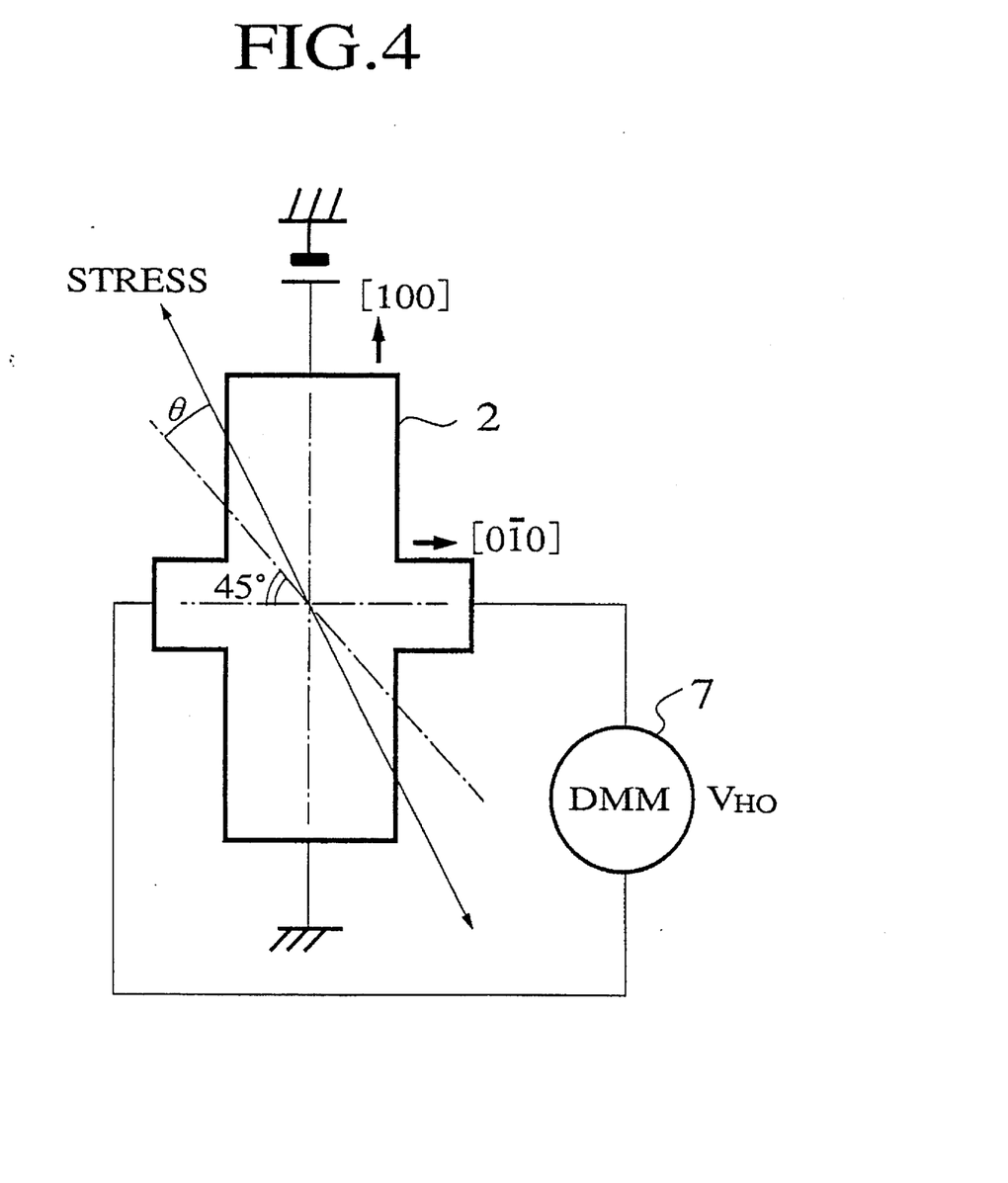
FIG. 4 explains a mechanism of causing an offset output $V_{HO}$ in a Hall device.

The reason why a fluctuation in the specific resistance of the active region of the Hall device causes the non-zero offset output $V_{HO}$ is because the specific resistance of the active region is closely related to the piezoelectric characteristic of the semiconductor crystal of the Hall device. The offset output $V_{HO}$ will vary if external stress is applied to locally change the specific resistivity. The reason why minute asymmetry in the Hall device causes the non-zero offset output $V_{HO}$ will be explained with reference to FIG. 4. The Hall device of FIG. 4 has a GaAs semiconductor substrate. An input bias voltage is applied in a [100] direction to the active region of the substrate. A voltmeter 7 measures a potential change in, for example, a [0$\bar{1}$0] direction, to detect the strength of a magnetic field that vertically traverses the Hall device. If a stress is applied at an angle of 45 degrees in an intermediate direction between the [100] and [0$\bar{1}$0] directions as shown in FIG. 4, the offset output $V_{HO}$ due to asymmetry in the device is zero because the stress is symmetrical with respect to these directions. If the direction of the stress forms an angle of θ with respect to the 45-degree direction as indicated with a dot-and-dash line in FIG. 4, the offset output $V_{HO}$ produced between the output terminals of the Hall device with no magnetic field is as follows:

$$V_{HO} = \frac{(\cos^2\theta - \sin^2\theta)(\pi_1 - \pi_t)Y \cdot S}{2} \cdot V_S \quad (1)$$

where $\rho_1$: piezoresistance coefficient in the longitudinal direction of the current $\rho_t$: piezoresistance coefficient in the transversal direction of the current Y: Young's modulus of the active layer S: strain of the active layer Vs: voltage applied to the device When there is a magnetic field, the output $V_M$ of the Hall device is as follows:

$$V_M = V_H - V_{HO} \quad (2)$$

When there is no magnetic field, the output $V_M$ of the Hall device is as follows:

$$V_M = V_{HO} \quad (3)$$

where $V_H$ is a change in the electromotive force between the output terminals of the Hall device due to the magnetic field.

Figure 3:
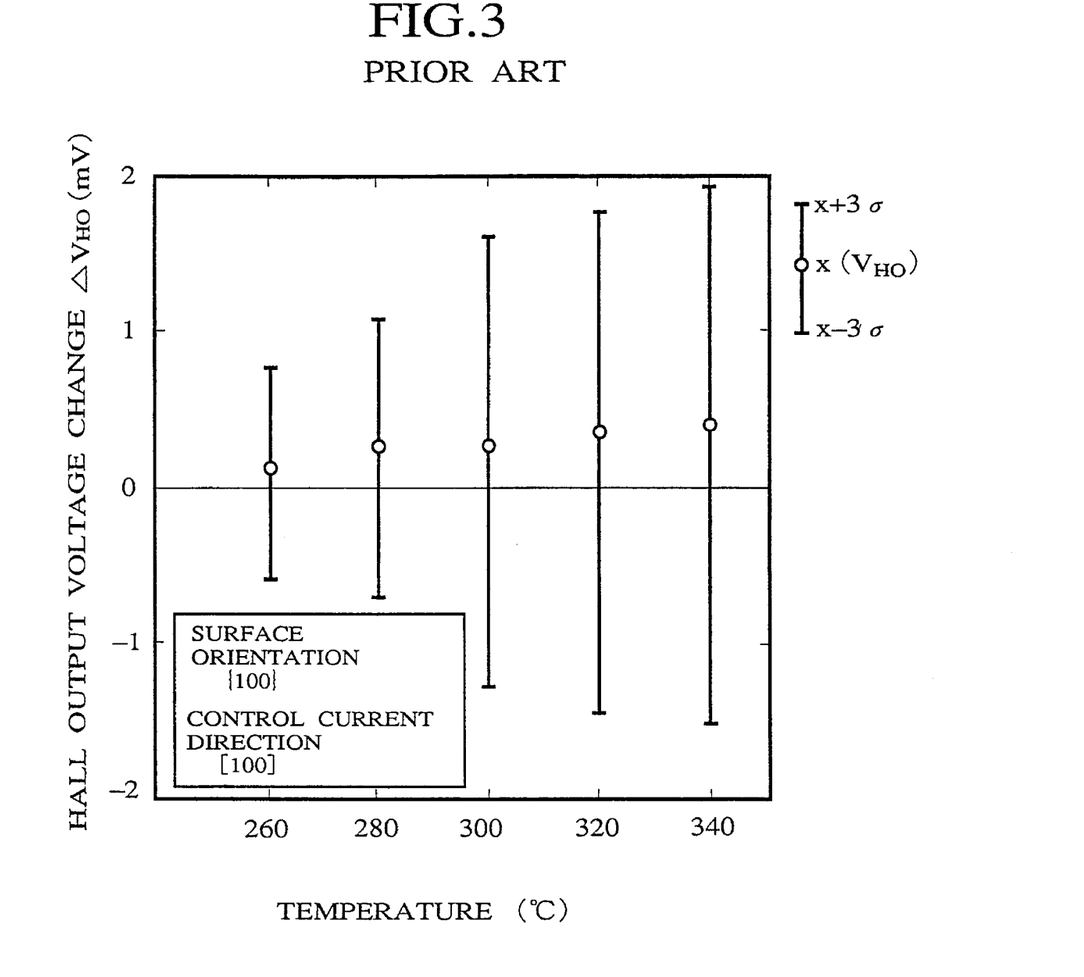
FIG. 3 shows a result of a solder step stress test on Hall devices according to the prior art.

When leads are soldered to the Hall device, thermal stress is applied to the device depending on the thermal-expansion coefficient thereof. The thermal stress is also caused in a curing process, to change the offset output $V_{HO}$. This results in changing the output $V_M$ of the Hall device. FIG. 3 shows a result of a solder step stress test to measure a change in the offset output $V_{HO}$ of a Hall device during a lead soldering process. For the test, 20 samples, for example, of Hall devices are picked up. The offset output of each of the samples is measured at the room temperature. This offset output is an initial offset output $V_{HOO}$. The samples are dipped in a solder bath of 260° C. for 10 seconds and are cooled to the room temperature. Then, the offset output of each of the samples is measured. This offset output is $V_{HO}(260°\ C.)$. A difference between the measured offset outputs is calculated as $\Delta V_{HO}(260°\ C.) = V_{HO}(260°\ C.) - V_{HOO}$. The average and variance of the differences of the samples are calculated. These processes are repeated by increasing the temperature of the solder bath at intervals of 20° C. Namely, the test is repeated at 280°, 300°, 320°, and 340° C. At the same time, differences are calculated as Δ

$V_{HO}(280° C.) = V_{HO}(280° C.) - V_{HOO}$, $\Delta V_{HO}(300° C.) = V_{HO}(300° C.) - V_{HOO}$, and the like. As shown in FIG. 3, the differences $\Delta V_{HO}(260° C.)$, $\Delta V_{HO}(280° C.)$, etc., in the offset output $V_{HO}$ of the conventional Hall device range from ±1 mV to ±2 mV. Namely, the reliability of the conventional Hall devices is insufficient to precisely measure a magnetic field.

To deal with this problem, a user must cancel, when accurately measuring a magnetic field, the offset output $V_{HO}$ of a Hall device by adjusting circuit constants of the device when assembling the device in a system. The system, however, will be incorrect if the offset output $V_{HO}$ varies thereafter. Namely, the conventional Hall devices may roughly detect, for example, the rotational position of a rotor of a brushless motor but are unreliable and inaccurate for measuring a magnetic field in current transformers and wattmeters, or for detecting the rotational position of devices installed in a car.

SUMMARY OF THE INVENTION

An object of the present invention is to provide a reliable and accurate semiconductor Hall device.

Another object of the present invention is to provide a semiconductor Hall device that minimizes a fluctuation in the offset output thereof when there is no magnetic field, even if the Hall device receives thermal stress when assembling the device into a system.

Figure 5:
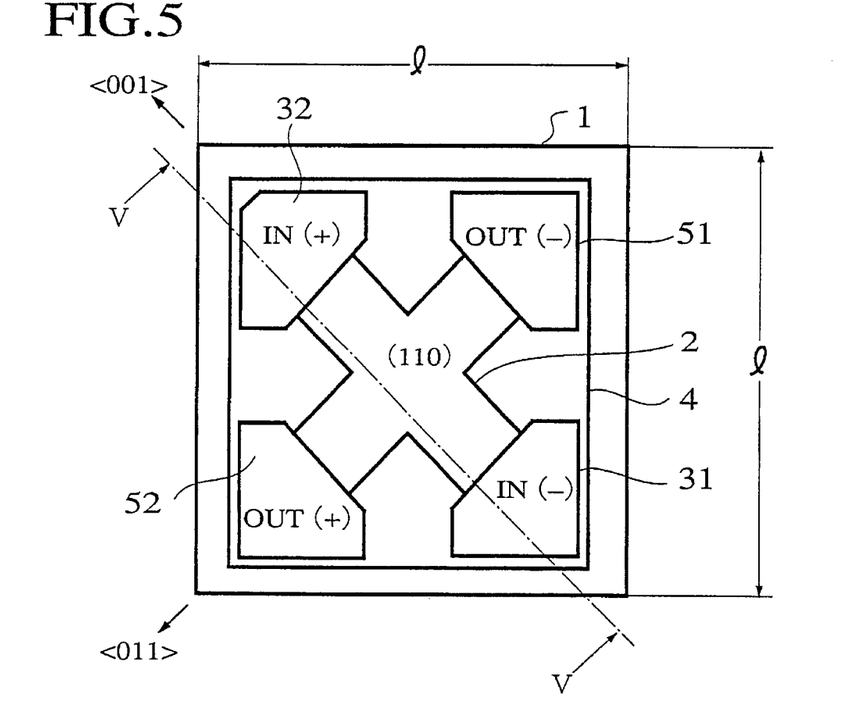
FIG. 5 is a plan view showing a Hall device according to a first embodiment of the present invention.
Figure 8:
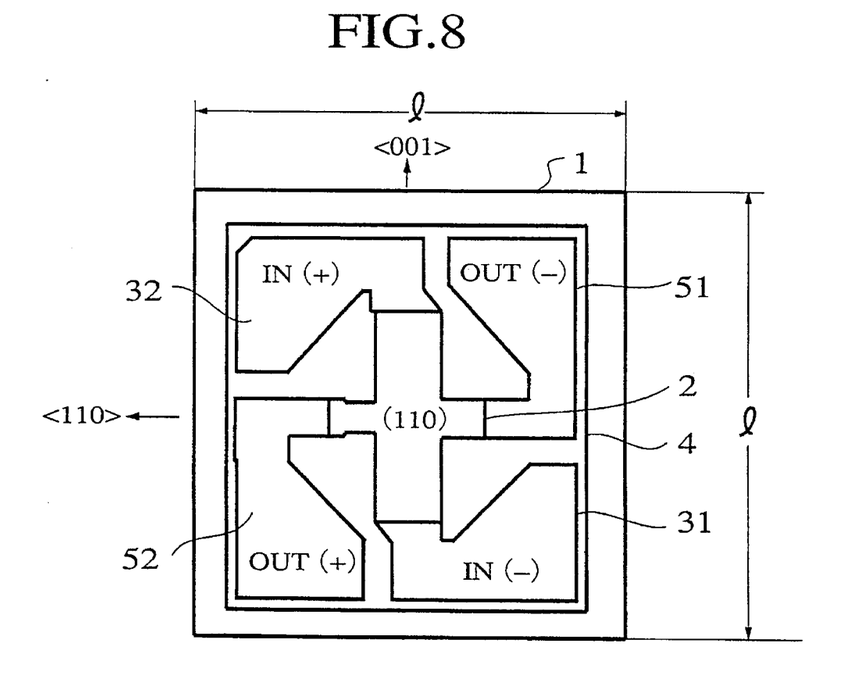
FIG. 8 is a plan view showing a Hall device according to a second embodiment of the present invention.

In order to accomplish the objects, the present invention provides semiconductor Hall devices shown in FIGS. 5 and 8. Each of these Hall devices has a substantially square shape with a side length of 1. The Hall device consists of a single-crystal semiconductor substrate 1 having a thickness of t, an active region 2 formed on the surface of the substrate 1, a pair of input current terminals 31 and 32 for passing a given current through the active region, and a pair of output voltage terminals 51 and 52 for measuring a Hall voltage to be produced perpendicular to the direction of current flow. The principal surface of the substrate 1 where the active region 2 is formed is in a (110) plane. The ratio of the side length 1 of the square substrate to the thickness t thereof is substantially 2:1. The substrate 1 is fixed to a circuit board with resin.

The substrate may be a GaAs substrate, in particular, a semi-insulating GaAs substrate.

Figure 7:
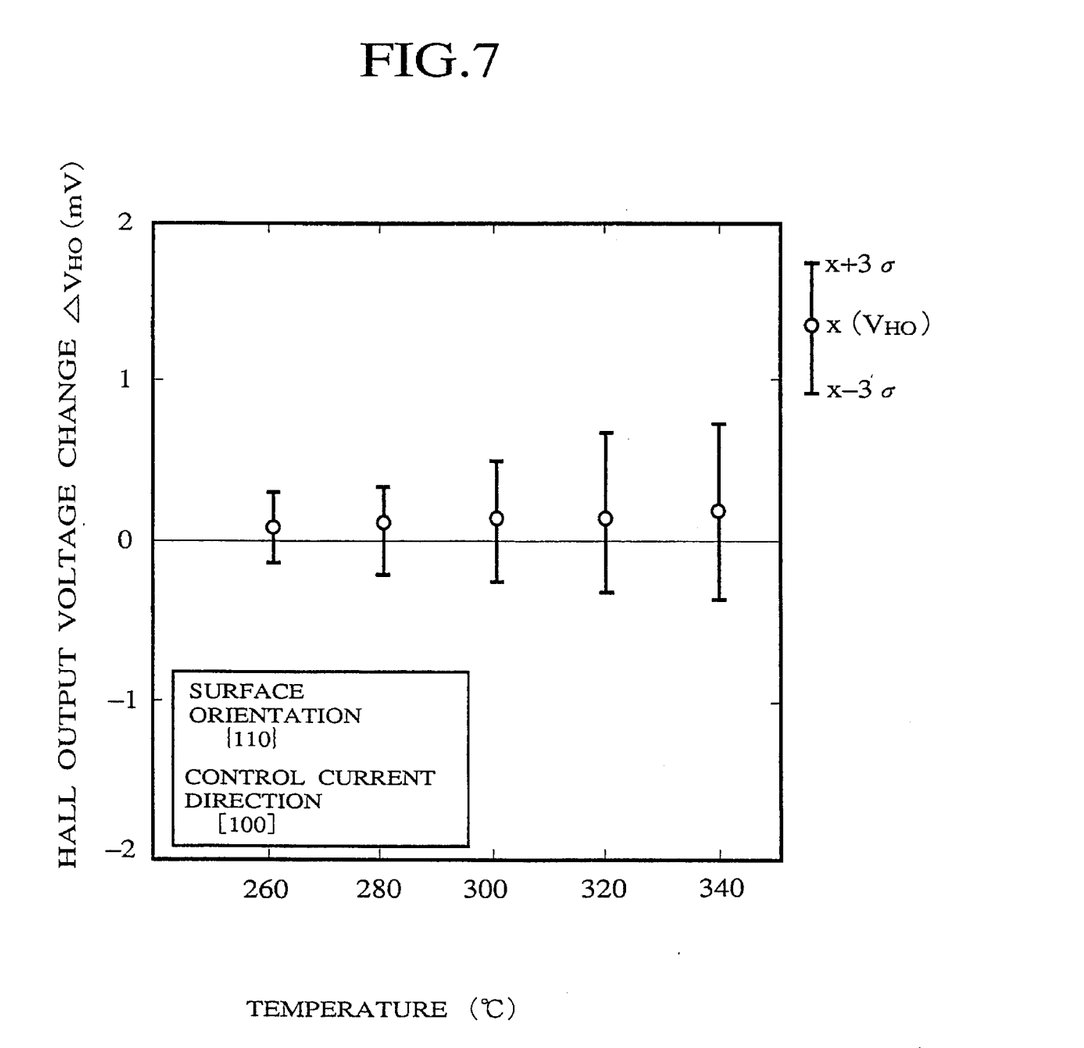
FIG. 7 shows a result of a solder step stress test on the Hall devices according to the first embodiment of the present invention.

As shown in FIG. 7, the Hall device of the present invention minimizes and stabilizes a fluctuation in the offset output thereof caused by thermal stress such as soldering heat stress. With the stabilized offset output, the Hall device accurately measures a magnetic field.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 6:
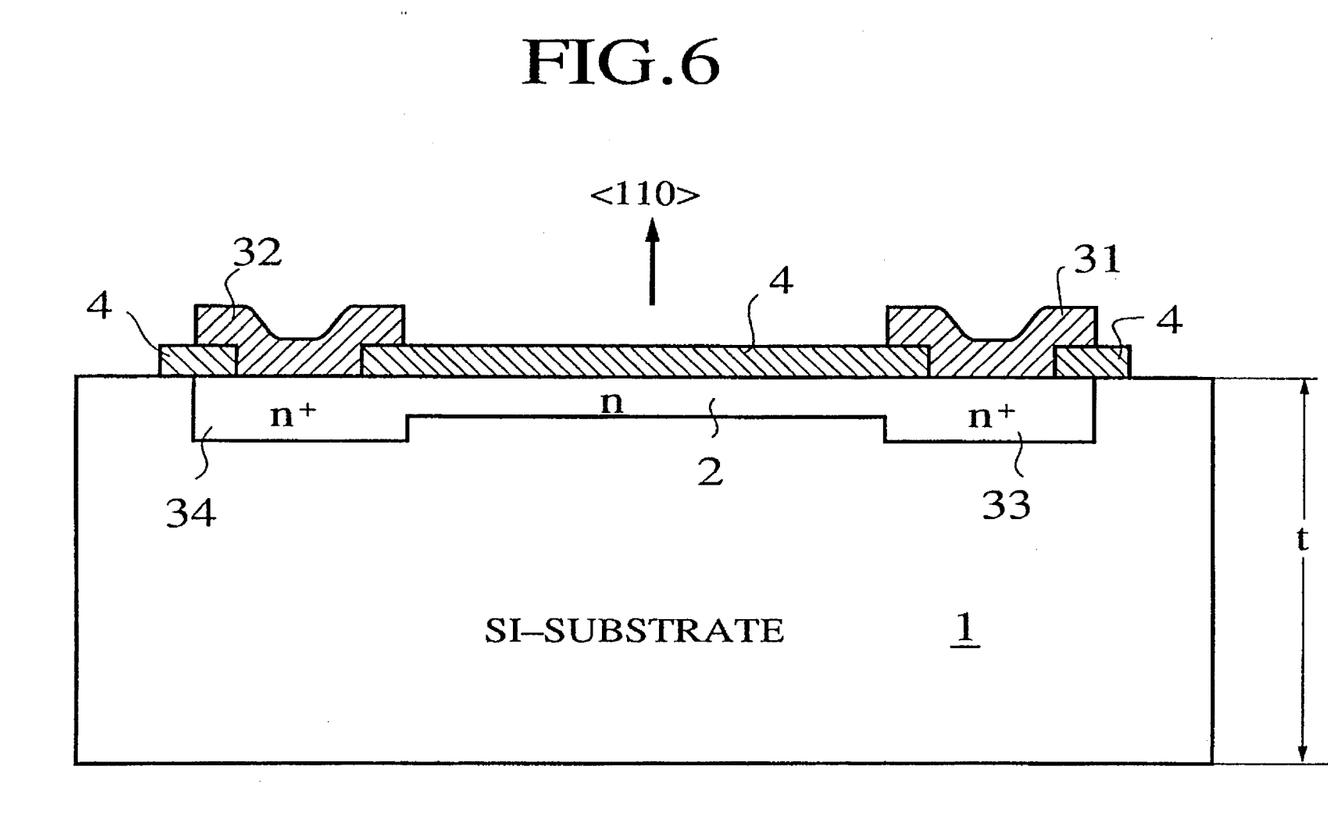
FIG. 6 is a sectional view taken along a line V—V of FIG. 5.

FIG. 5 is a plan view showing a semiconductor Hall device according to the first embodiment of the present invention, and FIG. 6 is a sectional view taken along a line V—V of FIG. 5. The Hall device consists of a square pellet 1 made of a semi-insulating GaAs substrate. The length of each side of the pellet 1 is 300 μm. A cross-shaped active region 2 is an n-type impurity region formed along the diagonals of the pellet 1. An insulation film 4 is made of, for example, silicon oxide or silicon nitride and covers the surface of the substrate. Contact windows are formed through the insulation film 4, to electrically connect the active region 2 to a pair of input terminals 31 and 32 and a pair of output terminals 51 and 52. The input and output terminals serve as bonding pads. The substrate is preferably a non-doped semi-insulating liquid-encapsulated Czochralski (LEC) GaAs or As pressure controlled Czochralski (PCZ) GaAs substrate having a resistivity of at least $10^7$ Ω-cm. Residual impurities of this substrate include carbon (C) of $1\times10^{16}$ cm$^{-3}$ or below and boron (B) of $1\times10^{17}$ cm$^{-3}$ or below. The substrate may be a Cr-doped semi-insulating GaAs substrate. The active region 2 is formed by selectively implanting n-type impurity ions such as silicon ions to the substrate by photolithography and ion-implantation method and by carrying out a heat treatment thereafter. The concentration of silicon is in the range of $1\times10^{15}$ to $1\times10^{17}$ cm$^{-3}$, for example $5\times10^{16}$ cm$^{-3}$. After the ion implantation, the substrate is annealed so that the active region 2 is formed to a depth of about 0.5 μm from the surface of the substrate and is activated. Under the input terminals 31 and 32, n$^+$-type contact regions 33 and 34 are formed to a depth of about 0.7 μm from the surface of the substrate. The impurity concentration of the contact regions 33 and 34 is in the range of, for example, $1\times10^{18}$ to $2\times10^{19}$ cm$^{-3}$, which is slightly higher than that of the active region 2. The contact regions 33 and 34 may be formed by photolithography and silicon-ion-implantation and by carrying out a heat treatment thereafter. The insulation film 4 on the substrate is 300 nm in thickness. Through contact windows formed through the insulation film 4, the input terminals 31 and 32 are connected to the contact regions 33 and 34. Other n$^+$-type contact regions (not shown) are formed under the output terminals 51 and 52, similar to FIG. 6. The input terminals 31 and 32 may have a three-layer structure consisting of an AuGe layer of 300 nm thick, an Mo layer of 150 nm thick, and an Au layer of 800 nm thick. Instead, the input terminals 31 and 32 may have a four-layer structure consisting of an AuGe layer of 280 nm thick, an Au layer of 250 nm thick, an Mo layer of 150 nm thick, and an Au layer of 800 nm thick. The pellet 1 is mounted on a proper circuit board with epoxy-based resin. The thickness of the resin is, for example, 200 nm. A voltage of 5 V is applied to the input terminals 31 and 32. Then, the output terminals 51 and 52 provide a Hall voltage due to a magnetic field that traverses the active region 2. The Hall voltage is measured to calculate the strength of the magnetic field.

What is important for the present invention is the orientation of the crystal of the pellet 1. The pellet 1 is cut out of a single-crystal GaAs ingot. The thickness of the pellet 1 is about 100 to 200 μm, preferably in the range of 140 to 150 μm. The pellet 1 must not be thinner than 140 μm due to mechanical strength. The length of each side of the pellet 1 is 300 μm, and therefore, the ratio of the side length "1" to the thickness "t" is about 2:1. This ratio is preferable in terms of thermal stress resistance. The pellet 1 must not be thicker than 200 μm, i.e., t/1 must not be greater than ⅔ because it makes the handling of the pellet difficult.

Ga and As in the GaAs substrate are equally arranged along a (110) plane, to establish an electrically neutral state along the (110) plane and provide a minimum piezoelectric effect. A single-crystal GaAs ingot is easily cleaved along the (110) plane. Namely, it is easy to cut the pellet 1 out of the ingot along the (110) plane. This results in improving the accuracy of processing the pellet 1.

Figure 9:
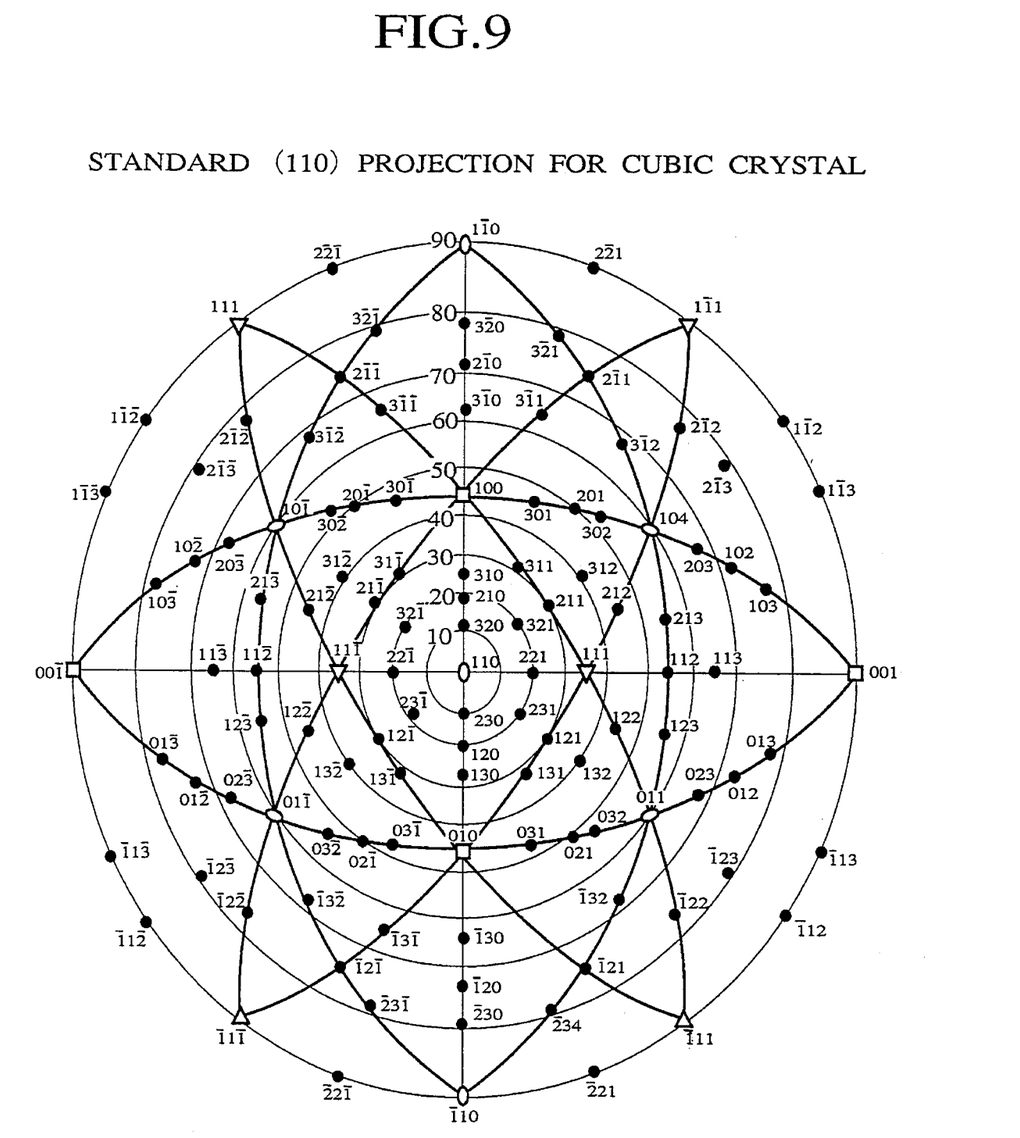
FIG. 9 is a standard (110) projection for a cubic crystal.

The direction of an input current on the pellet 1 is [001] that is orthogonal to the (001) plane. The full set of equivalent directions of [001], [00$\bar{1}$] is expressed as <001>. The direction of an output voltage on the pellet 1 is [1$\bar{1}$0]. The full set expression of equivalent direction of [1$\bar{1}$0], [1$\bar{1}$0], [$\bar{1}$10], [110] is <110>. The side faces of the pellet 1 have no low-index plane as shown in FIG. 9. As shown at the periphery of the (110) projection, there is no exact plane intersecting the (110) plane at an angle of 90 degree in the 45 degree direction with respect to the [001] direction on (110) plane. In FIG. 5, the directions of the input current and output voltage may be reversed if the surface of the active region 2 is aligned with the (110) plane.

FIG. 7 shows a result of a heat environment test, i.e., a solder step stress test carried out on Hall devices prepared according to the first embodiment of the present invention. Each of the Hall devices has an active regions in the (110) plane. The solder step stress test is the same as that carried out on the prior art. Optional 20 samples of the Hall devices according to the first embodiment are selected. The offset output of each of the samples is measured at the room temperature. This offset output is represented as $V_{HOO}$. The samples are put in a solder bath of 260° C. for 10 seconds and are cooled to the room temperature. Then, the offset output $V_{HO}$(260° C.) of each of the samples is measured. For each of the samples, a difference $\Delta V_{HO}$(260° C.)=$V_{HO}$(260° C.)−$V_{HOO}$ is calculated, and the average and variance of the differences of the samples are calculated. These processes are repeated by increasing the temperature of the solder bath up to 340° C. at intervals of 20° C. As a result, the plot of FIG. 7 is obtained like FIG. 3. According to the prior art of FIG. 3, a fluctuation $\Delta V_{HO}$ in the offset output $V_{HO}$ is in the range of ±1 mV to ±2 mV, which is unreliable for accurately measuring a magnetic field. On the other hand, a fluctuation $\Delta V_{HO}$ in the offset output $V_{HO}$ according to the first embodiment of the present invention is about ±0.5 mV, to greatly improve the accuracy of measuring a magnetic field. The fluctuation $\Delta V_{HO}$ in the offset output $V_{HO}$ of FIG. 7 is due to thermal stress S caused by thermal expansion. Accordingly, the expression (1) becomes as follows:

$$\Delta V_{HO} = \frac{\partial V_{HO}}{\partial S} = \frac{(\cos^2\theta - \sin^2\theta)(\pi_1 - \pi_t)Y}{2} \cdot V_S \quad (4)$$

Since the principal surface of the pellet according to the present invention is in the (110) plane, the value ($\rho_1-\rho_t$) in the (110) plane is smaller than that in a (100) plane, to thereby reduce the fluctuation $\Delta V_{HO}$ due to the thermal stress S. According to the first embodiment of the present invention, the pellet 1 is fixed to a lead frame or stem on a circuit board with resin, to relax the strain of the active layer of the pellet. This results in further reducing the fluctuation $\Delta V_{HO}$.

FIG. 8 shows a Hall device according to the second embodiment of the present invention. This Hall device consists of a square pellet 1 having a side length 1 of 300 μm and made of a semi-insulating GaAs substrate. The semi-insulating GaAs substrate may be a non-doped LEC or non-doped PCZ GaAs substrate. The pellet 1 has an n-type active region 2 in which the direction of an input current is aligned parallel to the <001> direction that is orthogonal to one of the side faces of the pellet 1. Accordingly, the direction of an output voltage on the pellet 1 is along the <110> direction that is orthogonal to another side face of the pellet 1. The square pellet 1 is cut out of a single-crystal GaAs ingot so that it may have side faces in the planes (110) and (001). FIG. 9 shows the (1$\bar{1}$0), (001), ($\bar{1}$10), and (00$\bar{1}$) planes intersecting the (110) surface at 90° (see the periphery of the projection). In this case, the principal surface of the pellet 1 where the active region 2 is formed is in the (110) plane. The thickness "t" of the pellet 1 is in the range of 140 to 150 μm, and therefore, the ratio of the length "1" to the thickness "t" is about 2:1. Input terminals 31 and 32 and output terminals 51 and 52 are formed at the four corners of the pellet 1, respectively. The active layer 2 is away from the corners of the pellet 1, to relax the strain of the corners when the pellet 1 is diced. The area of the active layer 2 is smaller than the area of the pellet of the first embodiment of FIG. 5, to further reduce thermal strain and a fluctuation $\Delta V_{HO}$. Like the first embodiment, the pellet 1 is mounted on a circuit board with epoxy-based resin, to prevent strain. In this way, the Hall device according to the second embodiment is less affected by heat of soldering when the device is mounted on a circuit board, and involves little fluctuation in the offset output $V_{HO}$ thereof.

As explained above, the present invention provides a Hall device, or a Hall probe that is capable of precisely measuring a magnetic field and is applicable to car-mounted devices and wattmeters that must be reliable and correct. The principal surface of a pellet of the Hall device of the present invention is in the (110) plane, to prevent the chipping of the diced edges of the pellet when it is diced out of an ingot. Although the length of each side of the pellet is 300 μm in the above explanation, it is optional if the ratio of the length "1" to the thickness "t" is secured to about 2:1. For example, the side length 1 may be 800 μm and the thickness t is 400μm, to minimize stress and improve the handling and productivity of the pellet.

Various modifications will become possible for those skilled in the art after receiving the teachings of the present disclosure without departing from the scope thereof. In the above explanation, the substrate of the Hall device is made of GaAs. Instead, the substrate may be made of InAs, InSb, or Si.

What is claimed is:

1. A Hall device for measuring a magnetic field, which comprises:

(a) a single-crystal semiconductor substrate of (110) orientation, the substrate having a square flat shape with a side length of 1 and a thickness of t;

(b) an active impurity region formed on the (110) principal surface of said substrate;

(c) a pair of input current terminals for passing a predetermined current through said active region; and (d) a pair of output voltage terminals for measuring a potential difference to be produced in a direction orthogonal to the predetermined current, wherein:

the ratio of 1 to t is substantially 2:1.

2. A Hall device as claimed in claim 1, wherein said input current terminals are arranged to pass a current in a <001> direction.

3. A Hall device as claimed in claim 2, wherein said output voltage terminals are arranged to measure a Hall voltage generated in a <110> direction.

4. A Hall device as claimed in claim 1, wherein said substrate is a GaAs substrate.

5. A Hall device as claimed in claim 1, wherein said substrate is fixed to a circuit board with resin.

6. A Hall device as claimed in claim 1, wherein said substrate is a semi-insulating GaAs substrate, and said active region is an n-type impurity region formed in said substrate.

7. A Hall device as claimed in claim 6, wherein said active region is an n-type impurity region of $1\times10^{15}$ to $1\times10^{17}$ $cm^{-3}$ in impurity concentration, and wherein said Hall device further comprises $n^+$-type contact regions of $1\times10^{18}$ to $2\times10^{19}$ $cm^{-3}$ in impurity concentration formed on the surface of said substrate under said input current and output voltage terminals, respectively.

8. A Hall device for measuring a magnetic field, which comprises:

(a) a semi-insulating GaAs substrate of (110) orientation, the substrate having a square flat shape with a side length of 1 and a thickness of t;

(b) an active n-type impurity region of $1\times10^{15}$ to $1\times10^{17}$ $cm^{-3}$ in impurity concentration having a flat cross shape formed on the surface of said substrate;

(c) four $n^+$-type contact regions of $1\times10^{18}$ to $2\times10^{19}$ $cm^{-3}$ in impurity concentration formed on the surface of said substrate at four ends of said cross-shaped active region, respectively;

(d) an insulation film formed on the surface of said substrate;

(e) a pair of input current terminals made of metal connected to two of said contact regions through contact windows formed through said insulation film, the input current terminals are aligned parallel to the <001> direction; and (f) a pair of output voltage terminals connected to the other two of said contact regions through contact windows formed through said insulation film, the output voltage terminals are aligned to measure a Hall voltage along a <110> direction, wherein:

the ratio of 1 to t is substantially 2:1, and said substrate is fixed to a circuit board with resin.

\* \* \* \* \*